(12) United States Patent
van Zeijl (10) Patent No.: US 6,489,847 B1
(45) Date of Patent: Dec. 3, 2002

(54) LOW DISTORATION DRIVING AMPLIFIER FOR INTEGRATED FILTERS

(75) Inventor: Paulus Thomas Maria van Zeijl, Hengelo (NL)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/493,259

(22) Filed: Jan. 28, 2000

(51) Int. Cl.[7] ................................................. H03F 3/45
(52) U.S. Cl. ..................... 330/255; 330/257; 330/260
(58) Field of Search ................................ 330/255, 257, 330/259, 260, 258, 265, 270, 271

(56) References Cited

U.S. PATENT DOCUMENTS

| | | | |
|---|---|---|---|
| 4,749,956 A | | 6/1988 | Torelli et al. ............... 330/253 |
| 4,897,611 A | | 1/1990 | Laber et al. ................ 330/253 |
| 5,034,700 A | * | 7/1991 | Herrmann et al. .......... 330/253 |
| 5,144,259 A | * | 9/1992 | Yoshida ...................... 330/253 |
| 5,166,635 A | * | 11/1992 | Shih ............................ 330/255 |
| 5,172,073 A | * | 12/1992 | Fuji ............................ 330/255 |
| 5,302,917 A | | 4/1994 | Concorso .................... 330/264 |
| 5,475,343 A | * | 12/1995 | Bee ............................. 330/255 |
| 5,481,213 A | | 1/1996 | Johnson ...................... 327/108 |
| 5,504,458 A | * | 4/1996 | Van Brunt et al. .......... 330/255 |
| 5,568,093 A | | 10/1996 | Holzer ........................ 330/264 |
| 5,621,357 A | * | 4/1997 | Botti et al. .................. 330/260 |
| 5,734,293 A | | 3/1998 | Gross | |
| 5,815,040 A | | 9/1998 | Barbetta ..................... 330/264 |
| 5,900,780 A | * | 5/1999 | Hirose et al. ............... 330/260 |
| 5,929,616 A | * | 7/1999 | Perraud et al. ............. 323/274 |
| 5,990,742 A | * | 11/1999 | Suzuki ........................ 330/257 |
| 5,999,054 A | * | 12/1999 | Suzuki ........................ 330/260 |
| 6,060,940 A | * | 5/2000 | Chiozzi ...................... 330/264 |
| 6,160,450 A | * | 12/2000 | Eschauzier et al. ........ 330/260 |
| 6,163,217 A | * | 12/2000 | Matsubara et al. ......... 330/255 |
| 6,175,277 B1 | * | 1/2001 | Mavencamp ............... 330/264 |

FOREIGN PATENT DOCUMENTS

| | | |
|---|---|---|
| FR | 2 453 538 | 10/1980 |
| WO | WO92/07422 | 4/1992 |
| WO | WO93/16524 | 8/1993 |

OTHER PUBLICATIONS

Ernst H. Nordholt, "Design of High–Performance Negative––Feedback Amplifiers," Table of Contents, ISBN 0–444–42140–8 (vol. 7), Elsevier Scientific Publishing Company, 1983.

Peter M. Stroet, et al., "Realization of a 10 MHZ Integrated Bipolar DECT Band–Pass Filter," ESSCIRC '97, Southampton, UK, Sep. 16–18, 1997, pp. 244–247.

Wanlop Surakampontorn, et al., "Instrumentation Amplifiers using Operational Transconductance Amplifiers," International Journal of Electronics, 1991, vol. 71, No. 3, pp. 511–515.

Giuseppe Palmisano, et al., "High–Drive CMOS Current Amplifier," IEEE Journal of Solid–State Circuits, vol. 33, No. 2, Feb. 1998, pp. 228–236.

Callewaert et al., "Class AB CMOS Amplifiers with High Efficiency", IEEE Journal of Solid–State Circuits, vol. 25, No. 3, Jun. 1990, pp. 684–691, New York.

Surakampontorn et al., "Instrumentation amplifiers using operational transconductance amplifiers", International Journal of Electronics, vol. 71, No. 3, Sep. 1, 1991, pp. 511–515, London GB.

* cited by examiner

*Primary Examiner*—Robert Pascal
*Assistant Examiner*—Khanh Van Nguyen (57) ABSTRACT

Several embodiments of an intermediate frequency (IF) amplifier, which exhibit improved distortion characteristics, are disclosed for use in an integrated transceiver circuit. The amplifier has a differential stage comprising two transistors which compare a voltage derived from an amplifier input signal with a voltage derived from the amplifier output signal to determine the portion of a bias current which will be supplied to one or more current mirrors. Output current from the one or more current mirrors is further used to bias an output transistor which drives a load impedance.

17 Claims, 8 Drawing Sheets

LOW DISTORATION DRIVING AMPLIFIER FOR INTEGRATED FILTERS

BACKGROUND

The present invention is related generally to radio communication devices and, more particularly, to the improvement of distortion characteristics of amplifiers within the transceivers of radio communication devices.

Selectivity filters have conventionally been used in radio communication device transceivers to enable the transceivers to "tune" to a desired channel while rejecting other adjacent channels. Historically, selectivity filters consisted of discrete RLC components or Surface-Acoustic-Wave (SAW) devices. These types of selectivity filters were generally linear and thus did not significantly contribute to the inter-modulation distortion or 1 dB compression point (P1dB) of the overall transceiver. Inter-modulation distortion occurs when two interferers at two adjacent channels generate an inter-modulation component which falls into the selectivity filter band. As is known in the art, the third order intercept (IP3) of the filter provides a standard measure of the inter-modulation performance of the circuit. The 1 dB compression point (P1dB) represents a measure of the linearity of the filter and is the point at which the difference between measured output power from the filter is 1 dB below what would be expected due to a corresponding increase in input power to the filter.

Figure 1:
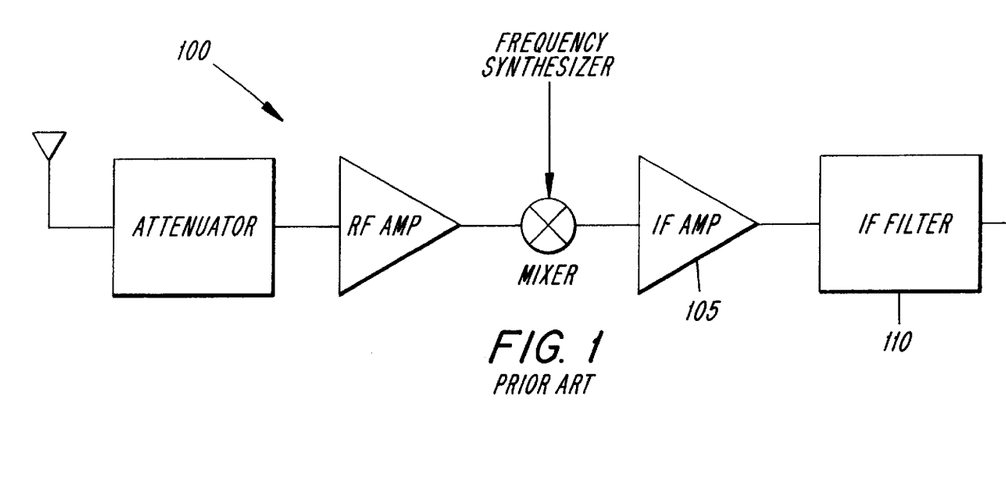
FIG. 1 is a block diagram of a portion of a conventional transceiver circuit.

Recently, selectivity filters such as Intermediate Frequency (IF) filters, along with associated driving amplifiers, have been relocated onto the same Application Specific Integrated Circuit (ASIC) as other transceiver circuitry. Integrated IF amplifier and filters, however, generally have degraded distortion performance. An IF amplifier 105 driving an integrated IF filter 110 in a conventional integrated transceiver circuit 100, such as that shown in FIG. 1, typically has an IP3 10–14 dB higher then the. P1dB. In the integrated IF filter 110, however, the difference between IP3 and P1dB can be as high as 20 dB. Therefore, the IF amplifier 105 limits the distortion characteristic of the combination of the IF amplifier 105 and the IF filter 110. The IF amplifier 105 thus significantly contributes to the overall transceiver distortion. In order to optimize the overall performance of an integrated transceiver, it would therefore be advantageous to reduce the distortion contributed by the IF amplifier which drives the IF filter.

SUMMARY

The above described desirable characteristics and others are provided by the following exemplary embodiments of the invention.

According to one exemplary embodiment of the invention, an amplifier is provided. The amplifier of this exemplary embodiment comprises: a first differential stage that compares a first voltage with a second voltage and generates a first output current; a first current mirror having an input coupled to receive the first output current and an output that supplies a second output current; and a first output transistor having an input coupled to receive the second output current, and an output for supplying a third output current for driving a load.

BRIEF DESCRIPTION OF THE DRAWINGS

The objects and advantages of the invention will be understood by reading the following detailed description in conjunction with the drawings in which.

DETAILED DESCRIPTION

Figure 2:
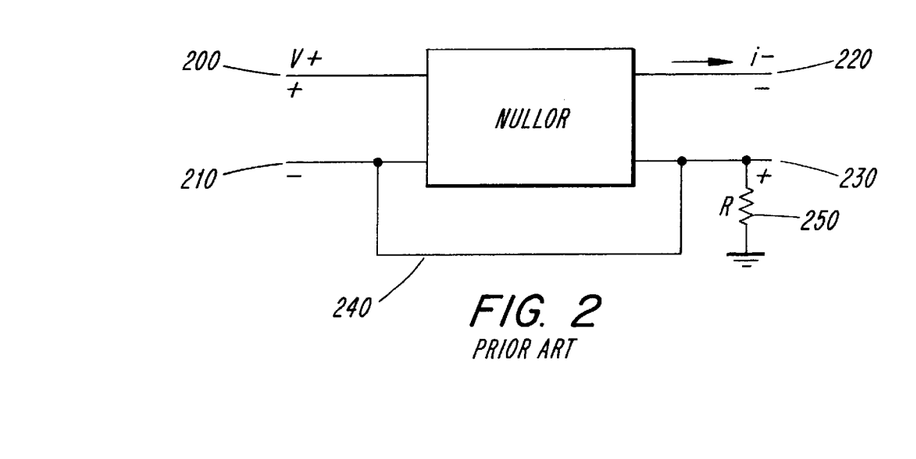
FIG. 2 is a block diagram of a conventional nullor amplifier.

In exemplary embodiments of the present invention, improved distortion characteristics are achieved using amplifiers designed in novel "nullor" configurations. Nullors are generally known in the art and are described, for example, in Ernst H. Nordholt, "Design of High-Performance Negative-Feedback Amplifiers," ISBN 0-444-42140-8 (Vol. 7) (Elsevier Scientific Publishing Company 1983), which is hereby incorporated herein by reference in its entirety. As shown in FIG. 2, conventional nullors are four terminal amplifying devices with a two terminal input comprising a positive input terminal 200 and a negative input terminal 210, and a two terminal:output comprising a negative output terminal 220 and a positive output terminal 230. The feedback loop is formed by connecting the positive output terminal 230 to the negative input terminal 210 and to the first terminal of resistor R 250, which has its second terminal connected to ground. FIG. 2 illustrates a transconductance, or voltage-to-current nullor amplifier, in which the input to the positive input terminal 200 is a voltage ($V_+$) and the output from the negative output terminal 220 is a current ($i_-$). The gain of the nullor is determined by R 250 in accordance with the following relation:

$$\frac{i_-}{V_+} = \frac{1}{R}$$

The distortion characteristics of the nullor are determined by the "loop gain" of the feedback through R 250 to the negative input terminal 210.

The exemplary embodiments of the present invention achieve improved distortion characteristics, including a very high 1 dB compression level and a high IP3, through the implementation of a high loop gain. High loop gain is accomplished using a differential amplifier stage to drive one or more current mirrors, with the one or more current mirrors providing current to drive an output transistor.

Figure 3:
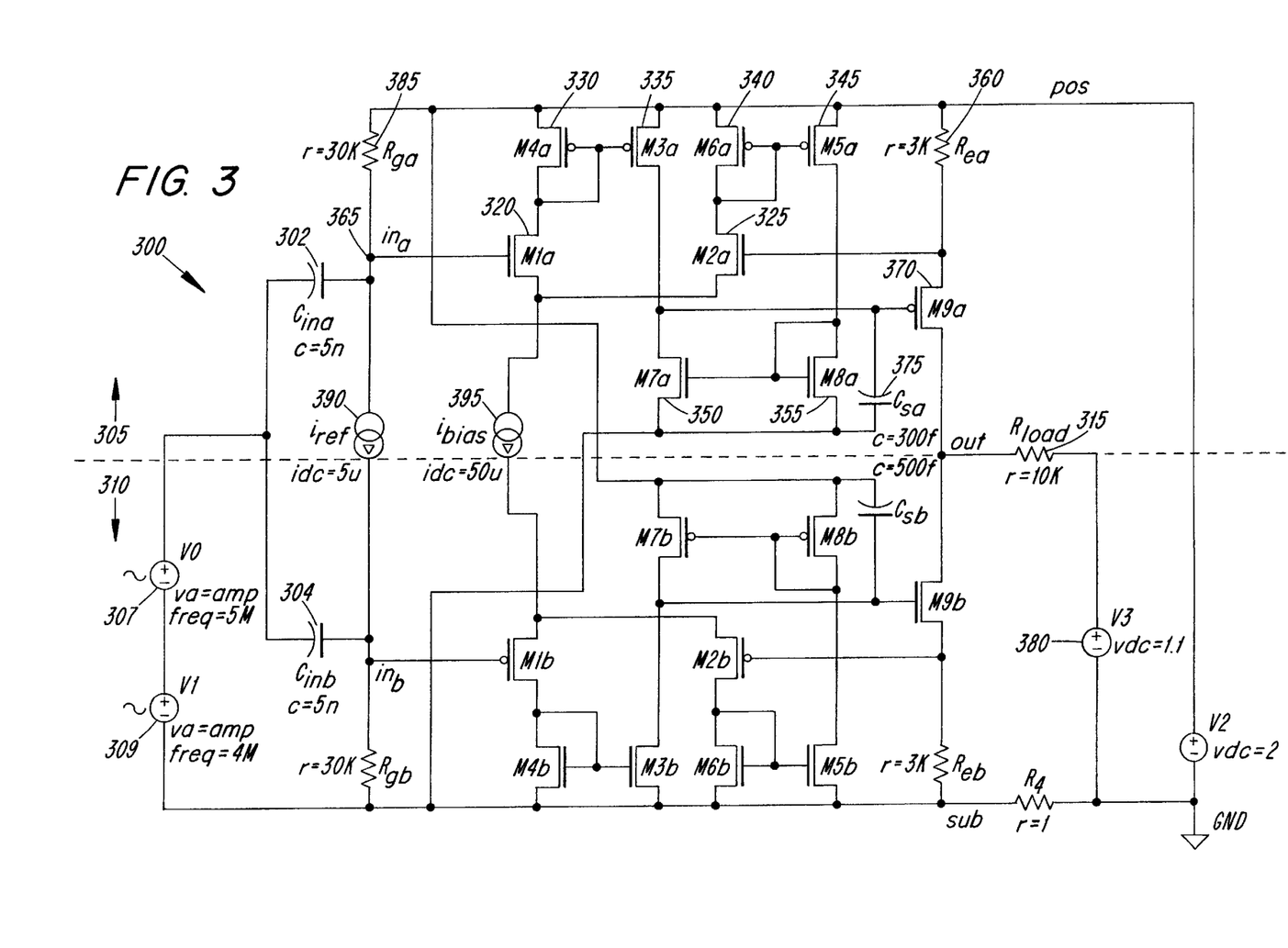
FIG. 3 is a schematic diagram of a transconductance amplifier circuit in accordance with a first exemplary embodiment of the invention.

A first exemplary embodiment of the present invention is schematically illustrated in FIG. 3. This exemplary embodiment represents a voltage-to-current nullor amplifier 300, which is designed to be driven by voltages supplied by a mixer and to supply an output current for driving an IF filter. The amplifier 300 comprises two circuit portions 305 and 310 which operate in a complementary fashion. The sum of the output currents from portions 305 and 310 drive the load resistor $R_{load}$ 315. Since portions 305 and 310 function in a substantially similar manner, but in a complementary fashion, the following description will focus on the upper portion 305 of the amplifier 300.

The principal "active" circuitry in the upper portion 305 of the amplifier 300 comprises transistors M1a 320 and M2a 325 as a differential input stage, transistors M3a 335 and M4a 330 as a current mirror for the output current of M1a 320, transistors M6a 340 and M5a 345 as a current "mirror" for the output current of M2a 325, transistors M7a 350 and M8a 355 as a current "mirror" for the output current of M5a 345, and transistor M9a 370 as the output stage of the upper portion 305 of the amplifier 300. In operation, n channel FETs M1a 320 and M2a 325 compare the, voltage across resistor $R_{ea}$ 360 to the input voltage at circuit node in$_a$ 365. Any difference between these voltages is converted to currents by M1a 320 and M2a 325. Current from M1a 320 is then supplied to M4a 330 and current from M2a 325 is supplied to M6a 340. M4a 330 is configured in a current "mirror" configuration with M3a 335, such that current supplied by M1a 320 to M4a 330 is reproduced in M3a 335. Similarly, M6a 340 is configured in a current "mirror" configuration with M5a 345 such that current supplied by M2a 325 to M6a 340 is reproduced in M5a 345. The current through M5a 345 is further supplied to M8a 355 and reproduced, via the current "mirror" configuration of M7a 350 and M8a 355, in M7a 350. The current from M8a 355, "mirrored" into M7a 350, and the current from M3a 335, serve to drive the gate of p channel FET M9a 370. Capacitor $C_{sa}$ 375 ensures the stability of this feedback loop.

The drain current of M9a 370 represents the output current ($i_o$) and is related to the input voltage $V_i$ (at node in$_a$ 365) by the following relation:

$$i_o = \frac{V_i}{R_{ea}}.$$

The output current $i_o$ drives the load resistance $R_{load}$ 315. A DC bias voltage V3 380 is further connected in series with $R_{load}$ 315. Resistor $R_{ga}$ 385, in conjunction with current source $i_{ref}$ 390, provides the biasing of the gate of input transistor M1a 320 and also, via the feedback loop, the current through the output transistor M9a 370. Bias current source $i_{bias}$ 395 provides biasing for the transistors of the entire amplifier except M9a. As discussed above, the lower portion 310 of the amplifier 300 operates similarly to the upper portion 305, but in a complementary fashion. Details of the operation of the lower portion 310 are therefore omitted.

The loopgain $G_L$ of the exemplary embodiments can be approximated by the following relation:

$$G_L = -2 \cdot \bar{g}_m \cdot Z_{OUT}$$

where $g_m$ is the average of the $g_m$'s of both transistors M1a and M2a; and $Z_{OUT}$ is the combined output impedance of M3a 335 and M7a 350.

The high combined output impedance of M3a 335 and M7a 350 therefore produces the high loop gain. The high loop gain furthermore increases the Third Order Intermodulation Intercept (IP3). Moreover, the output configuration (transistor M9a 370 and M9b) results in a nearly rail-to-rail capability, and thus a very high P1dB. The large difference between P1dB and IP3 leads to improved distortion characteristics over conventional IF amplifiers.

Figure 4:
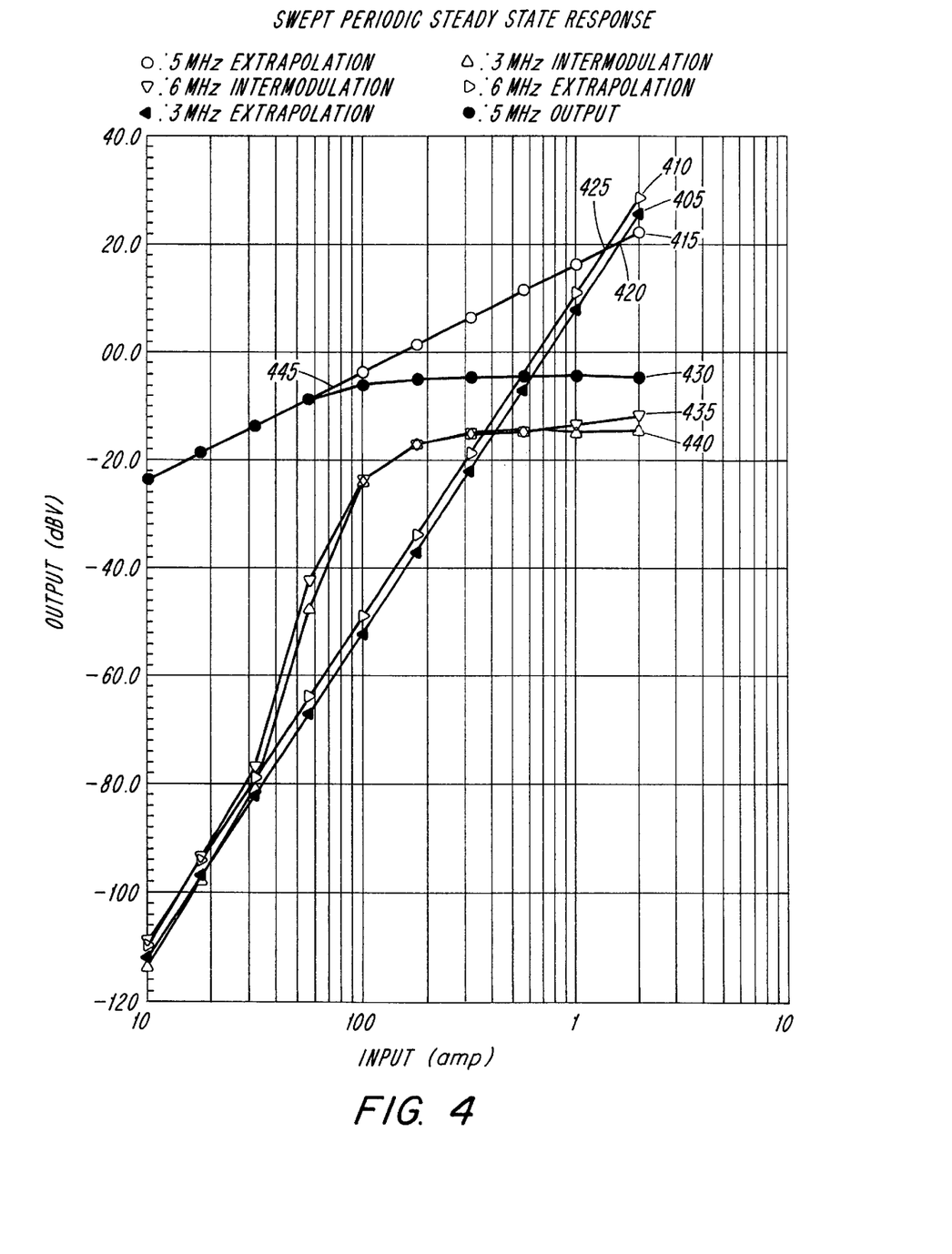
FIG. 4 is a plot of the output vs. the input of the exemplary transconductance amplifier of FIG. 3.

Simulated performance of the exemplary amplifier of FIG. 3 is plotted in FIG. 4 which plots the amplifier input in millivolts on the X-axis and the amplifier output in dBV on the Y-axis. The 4 MHZ and 5 MHZ sources 307 and 309 of FIG. 3 produce third order intermodulation components at 2(4)−5=3 MHz and 2(5)−4=6 MHZ. Extrapolation curves of the 3 MHz and 6 MHz third order intermodulation components are shown at 405 and 410, respectively. An extrapolation curve of the 5 MHz signal is further shown at 415. The intersection of the 3 MHz extrapolation curve 405 with the 5 MHz extrapolation curve 415 indicates the third order intercept point (IP3) 420, and the intersection of the 6 MHz extrapolation curve 410 with the 5 MHz extrapolation curve 415 indicates the third order intercept points (IP3) 425. Simulated performance of the amplifier of FIG. 3 is shown in curves 430, 435 and 440. Curve 430 depicts the simulated transfer of the 5 MHZ source 307 from the input to the output of the amplifier. Curves 435 and 440 further depict the simulated transfer of the 6 MHZ and 3 MHZ intermodulation components from the input to the output of the amplifier. Point 445 in curve 415 represents the P1dB point of the amplifier and indicates the point where compression occurs in the 5 MHz output (i.e., where the difference between the 5 MHz output 430 and the 5 MHz extrapolation curve 415 is 1 dB).

Figure 5:
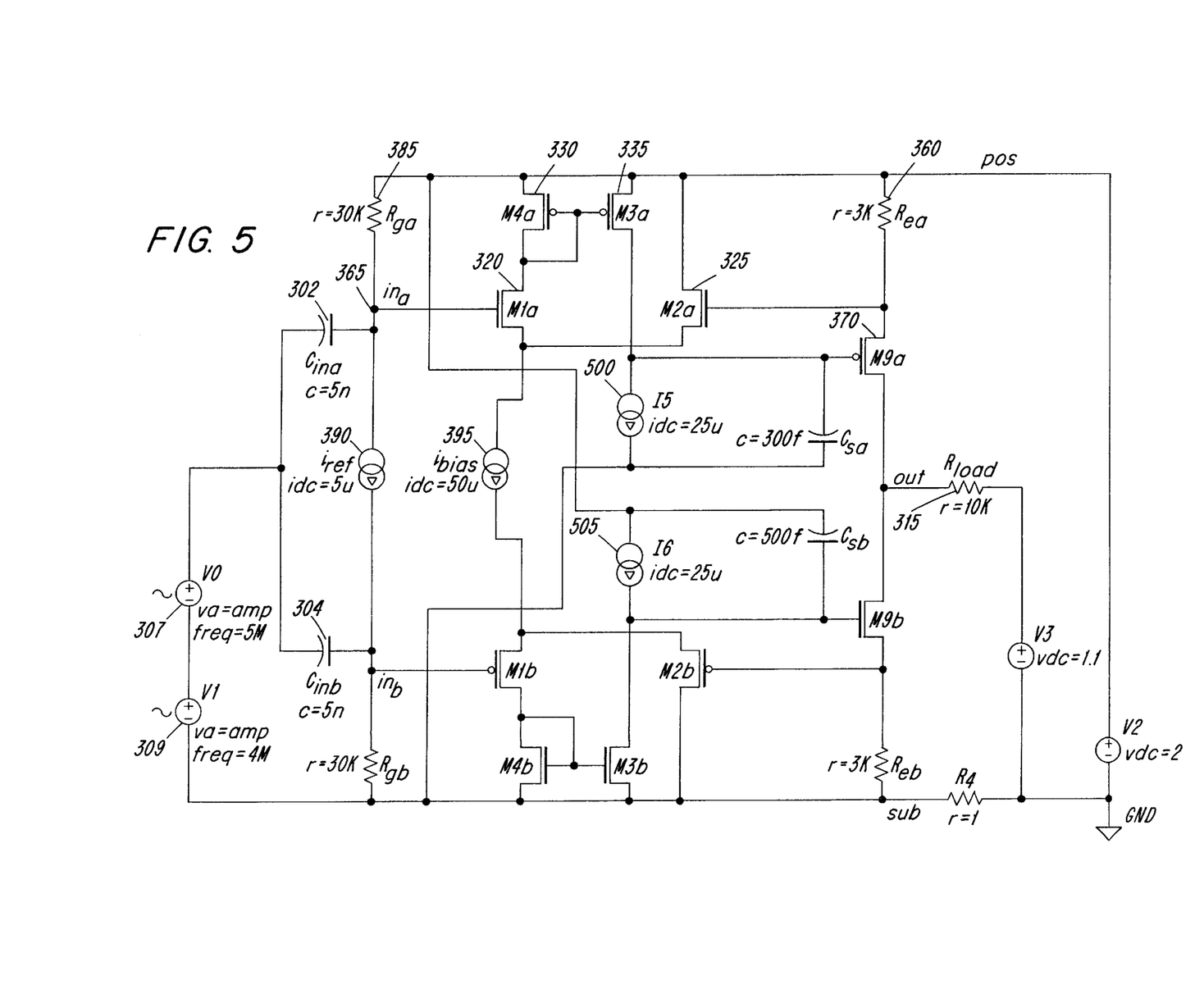
FIG. 5 is a schematic diagram of a transconductance amplifier circuit in accordance with a second exemplary embodiment of the invention.
Figure 6:
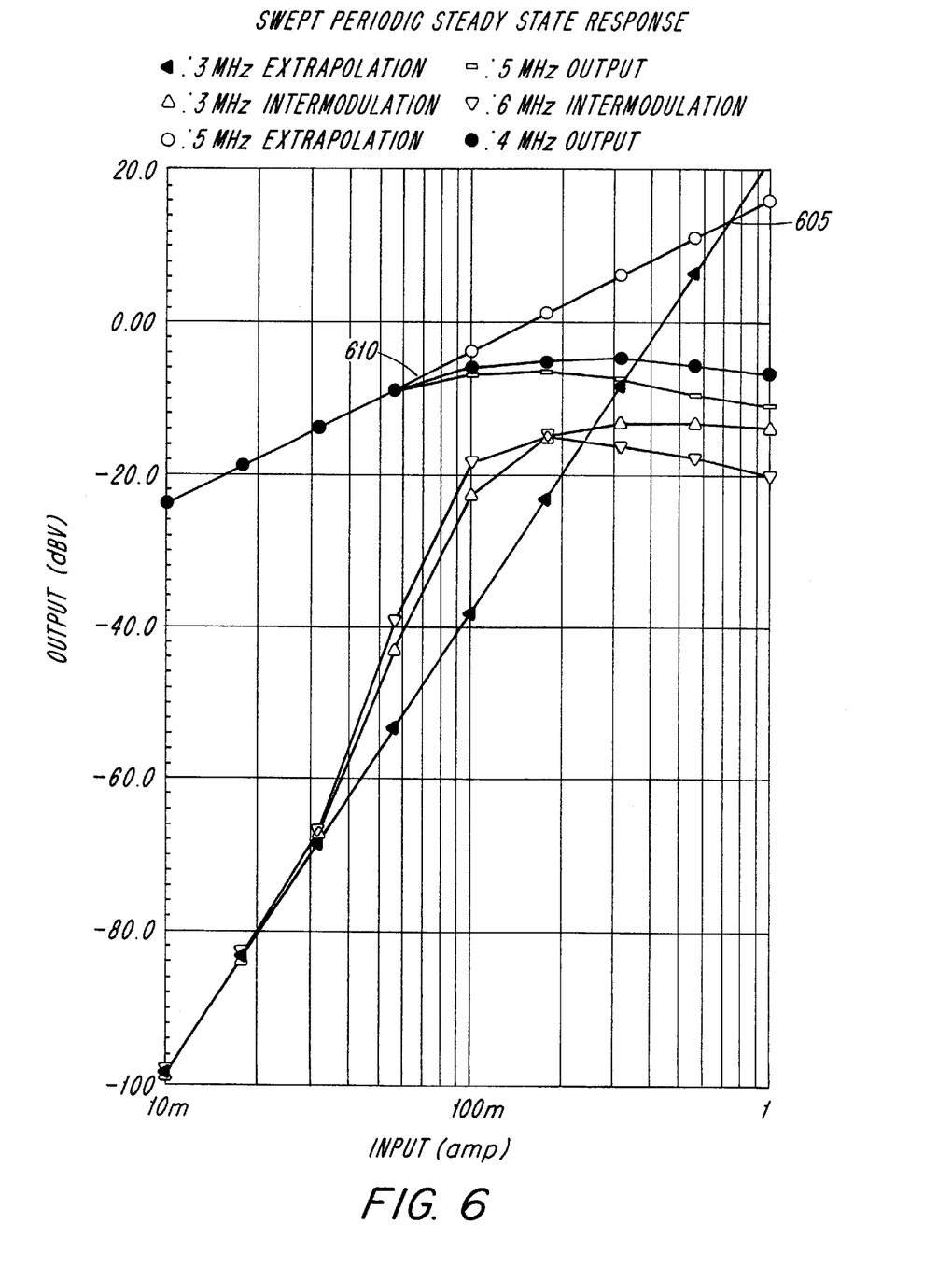
FIG. 6 is a plot of the output vs. the input of the exemplary transconductance amplifier of FIG. 5.

FIG. 5 illustrates another exemplary embodiment of the present invention wherein the current mirrors corresponding to those embodied by transistors M6a and M5a, M7a and M8a, M6b and M5b, and M7b and M8b contained in the FIG. 3 embodiment have been removed. Removal of the four current mirrors advantageously results in less use of semiconductor area when the amplifier is fabricated in an integrated circuit. Current mirrors M6a and M5a and M7a and M8a are replaced, in the FIG. 5 embodiment, by constant current source $I_5$ 500. Current mirrors M6b and M5b and M7b and M8b are further replaced by the constant current source $I_6$ 505. Since the current mirrors comprising M5a, M6a, M7a and M8a are not present in the amplifier of FIG. 5, the current of M2a is not used in the feedback loop. The loopgain of the amplifier of FIG. 5 is therefore approximately one half of the loop gain of FIG. 3. Simulated performance of the exemplary amplifier of FIG. 5 is plotted in FIG. 6, which plots the amplifier input in millivolts on the X-axis and the amplifier output in dBV on the Y-axis. As can be seen in FIG. 6, with decreased loopgain, the third order intercept (IP3) 605 is about 7 dB lower than the IP3 depicted in FIG. 4. The P1dB 610, however, is approximately the same. The lowering of the IP3 therefore represents a degraded distortion performance as compared to the amplifier of FIG. 3.

Figure 7:
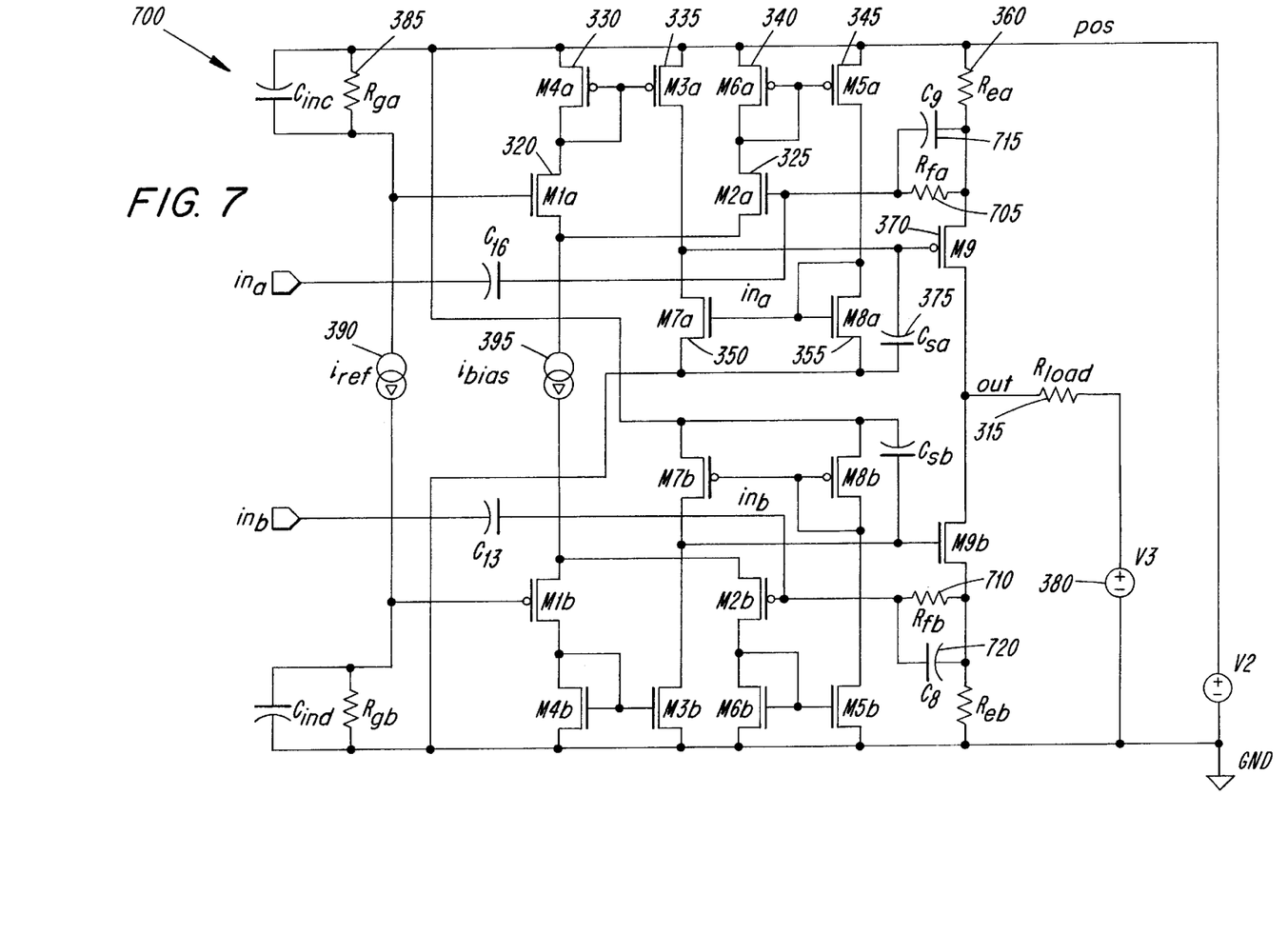
FIG. 7 is a schematic diagram of a current amplifier circuit in accordance with a third exemplary embodiment of the invention.

FIG. 7 illustrates a further exemplary embodiment of the present invention, in which an amplifier 700 has been designed to receive input current signals, instead of voltage signals. The amplifier 700 thus represents a current-to-current amplifier. Resistors $R_{fa}$ 705 and $R_{fb}$ 710 have been added as extra feedback resistors and to define the amplifier gain. The gain of amplifier 700 is defined as the following:

$$\frac{i_o}{i_i} = 1 + \frac{R_{fa}}{R_{ea}}$$

To ensure stability, capacitors $C_9$ 715 and $C_8$ 720 have been placed in parallel with $R_{fa}$ 705 and $R_{fb}$ 710, respectively, to create a "phantom-zero."

Figure 8:
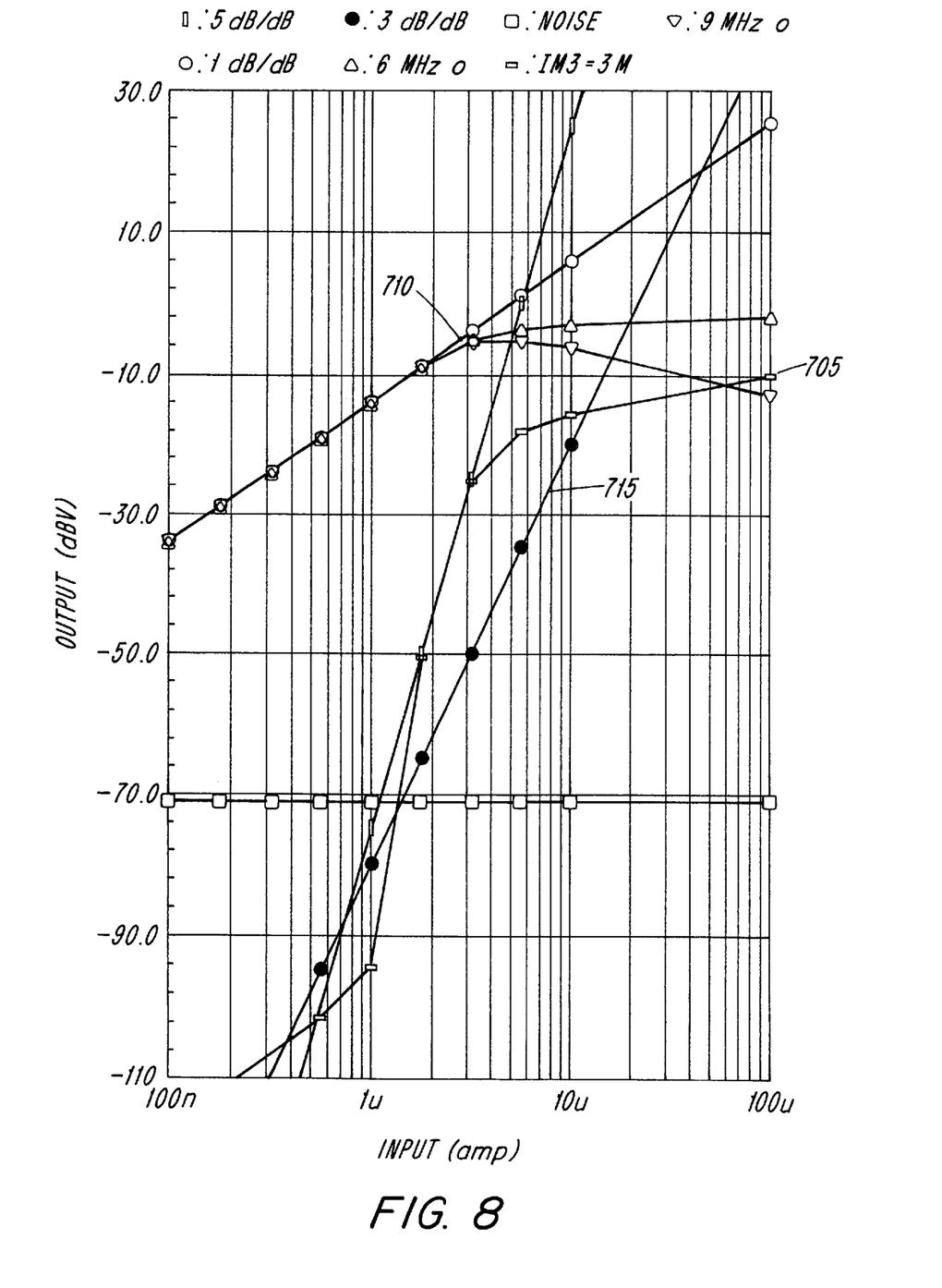
FIG. 8 is a plot of the output vs. the input of the exemplary current amplifier of FIG. 7.

FIG. 8 illustrates the extrapolated and simulated performance of the current amplifier of FIG. 7, with the amplifier inputs assumed to be 6 and 9 MHz signals. With input signals of 6 and 9 MHz, the third order intermodulation components are 2(6)–9=3 MHZ and 2(9)–6=12 MHz. The 3 MHz intermodulation component is depicted by curve 705. The P1dB is depicted at 710, and is quite similar to those in FIGS. 4 and 6. The third order extrapolation is shown plotted as curve 715. As can be seen from the plot, the 3 MHz intermodulation curve 705 does not coincide with the 3 MHz extrapolation curve 715. The actual slope of curve 705 is steeper then the extrapolated curve 715, indicating that the intermodulation is actually fifth order and not third order. Consequently, an IP3 cannot be defined. Comparing the level of intermodulation for a given output level of the plots of FIGS. 4 and 8, it can be seen that the performance of FIG. 8 is approximately 10 dB better than that of FIG. 4.

Figure 9:
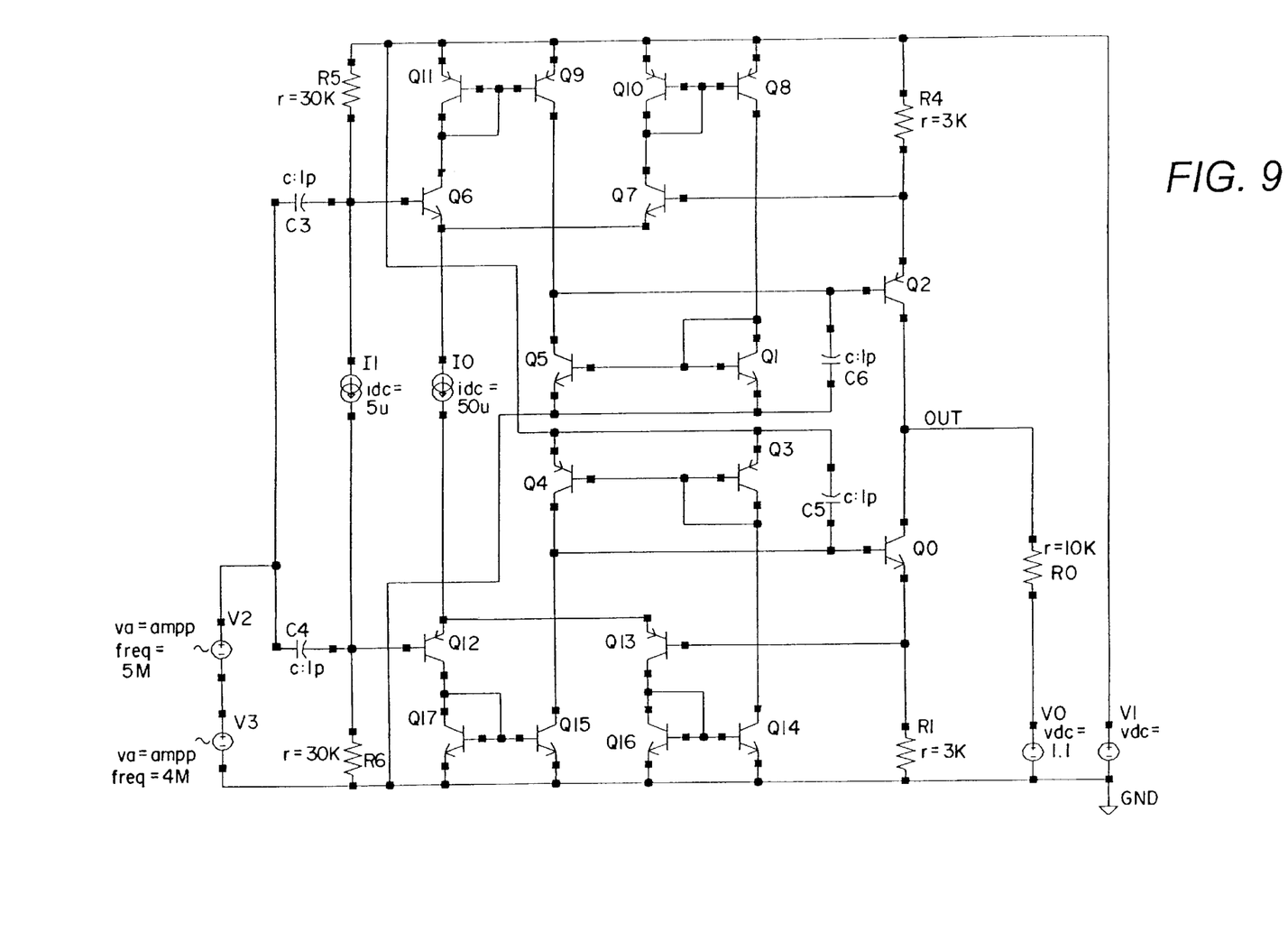
FIG. 9 is a schematic diagram of a transconductance amplifier circuit having BJT transistors in accordance with another exemplary embodiment of the invention.

Though the exemplary embodiments shown in FIGS. 3, 5, and 7 use FETs, one skilled in the art will recognize that BJTs could be equivalently used to achieve similar performance. FIG. 9 shows an example of a schematic having BJT's instead of FETs. Additionally, one skilled in the art will appreciate that the various transistors in the different exemplary embodiments could be cascoded to increase the output impedance of the current mirrors, thus improving the loopgain at low frequencies.

In the FIG. 3 and FIG. 5 exemplary embodiments, capacitors $C_{ina}$ 302 and $C_{inb}$ 304 couple input voltages $V_0$ 307 and $V_1$ 309 to the upper 305 and lower 310 portions of the amplifier. However, one skilled in the art will appreciate that these capacitors can be replaced with a conventional DC-level shift circuit. Furthermore, in the exemplary embodiments shown in FIG. 3 and FIG. 5, the inputs of the amplifier are connected in parallel, via coupling capacitors $C_{ina}$ 302 and $C_{inb}$ 304. However, depending on the particular desired application, one input can alternatively be grounded while the other is used as an input, or both inputs can be connected to two different voltage source inputs and used for adding/subtracting the voltage inputs.

Although, in the exemplary embodiments of FIGS. 3, 5, and 7, the upper 305 and lower 310 portions of the amplifier are connected together and function in a complementary fashion, it is possible, in particular applications, to have alternative embodiments of the invention that utilize only one circuit portion (305 or 310). For example, if the voltage input signal will solely be a positive DC voltage, the upper portion 305 of the exemplary embodiments would be sufficient to amplify the signal.

Although a number of embodiments are described herein for purposes of illustration, these embodiments are not meant to be limiting. Those skilled in the art will recognize modifications that can be made in the illustrated embodiment. Such modifications are meant to be covered by the spirit and scope of the appended claims.

What is claimed is:

1. An amplifier comprising:
   a first differential stage that compares a first voltage with a second voltage and generates a first output current, wherein the second voltage is derived from a feedback impedance;
   a first current mirror having an input coupled to receive the first output, current and an output that supplies a second output current; and
   a first output transistor having an input terminal coupled to receive the second output current, an output terminal for supplying a third output current for driving a load and a terminal for feedback to the first differential stage.

2. The amplifier of claim 1, wherein the first differential stage further generates a fourth output current based on the comparison between the first and second voltages.

3. The amplifier of claim 2, further comprising a second current mirror having an input coupled to receive the fourth output current and an output that supplies a fifth output current.

4. The amplifier of claim 3, further comprising a third current mirror having an input coupled to receive the fifth output current and an output that supplies a sixth output current.

5. The amplifier of claim 4, wherein the input of the first output transistor is further coupled to receive the sixth output current.

6. The amplifier of claim 1, wherein at least one of the first differential stage, the first current mirror and the first output transistor comprises at least one FET transistor.

7. The amplifier of claim 1, wherein at least one of the first differential stage, the first current mirror and the first output transistor comprises at least one BJT transistor.

8. The amplifier of claim 1, wherein at least one of said first and second voltages is coupled via a coupling capacitor.

9. The amplifier of claim 1, wherein at least one of said first and second voltages is coupled via a DC- level shift circuit.

10. An amplifier comprising:
    a first differential stage that compares a first voltage with a second voltage and generates a first output current;
    a first current mirror having an input coupled to receive the first output current and an output that supplies a second output current; and
    a first output transistor having an input terminal coupled to receive the second output current, an output terminal for supplying a third output current for driving a load and a terminal for feedback to the first differential stage;
    a second differential stage that compares a third voltage with a fourth voltage and generates a fourth output current, wherein the fourth voltage is derived from a feedback impedance;

a second current mirror having an input coupled to receive the fourth output current and an output that supplies a fifth output current; and a second output transistor having an input terminal coupled to receive the fifth output current, an output terminal for supplying a sixth output current for driving the load and a terminal for feedback to the second differential stage.

11. The amplifier of claim 10, wherein the second differential stage further generates a seventh output current based on the comparison between the third and fourth voltages.

12. The amplifier of claim 11 further comprising a third current mirror having an input coupled to receive the seventh output current and an output that supplies an eighth output current.

13. The amplifier of claim 12, further comprising a fourth current mirror having an input coupled to receive the eighth output current and an output that supplies a ninth output current.

14. The amplifier of claim 13, wherein the input of the second output transistor is further coupled to receive the ninth output current.

15. The amplifier of claim 10, wherein at least one of the first differential stage, the second differential stage, the first current mirror, the second current mirror, the first output transistor, and the second output transistor comprises at least one FET transistor.

16. The amplifier of claim 10, wherein at least one of the first differential stage, the second differential stage, the first current mirror, the second current mirror, the first output transistor, and the second output transistor comprises at least one BJT transistor.

17. An amplification method comprising:

comparing a first voltage with a second voltage and generating therefrom a first output current, wherein the second voltage is derived from a feedback impedance;

generating a second output current by mirroring the first output current; and receiving the second output current at a first terminal, generating therefrom a third output current for driving a load from a second terminal and receiving a feedback at a third terminal.

* * * * *